United States Patent
Foehringer et al.

(10) Patent No.: US 7,533,457 B2
(45) Date of Patent: May 19, 2009

(54) PACKAGING METHOD FOR CIRCUIT BOARD

(75) Inventors: Richard B Foehringer, El Dorado Hills, CA (US); Jason E Snodgress, Cameron Park, CA (US); Steven R. Eskildsen, Folsom, CA (US); John G. Meyers, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 338 days.

(21) Appl. No.: 11/173,219

(22) Filed: Jun. 30, 2005

(65) Prior Publication Data

US 2007/0004095 A1 Jan. 4, 2007

(51) Int. Cl.
*H01R 43/00* (2006.01)
*H05K 3/30* (2006.01)

(52) U.S. Cl. .............. 29/825; 29/832; 29/833; 29/840

(58) Field of Classification Search .......... 29/825, 29/832, 833, 840
See application file for complete search history.

(56) References Cited

U.S. PATENT DOCUMENTS

| | | | |
|---|---|---|---|
| 5,460,547 A | 10/1995 | Belt et al. | |
| 5,568,359 A | 10/1996 | Cavello et al. | |
| 5,930,110 A | 7/1999 | Nishigaki et al. | |
| 5,982,614 A | 11/1999 | Reid | |
| 6,064,566 A | 5/2000 | Agata et al. | |
| 6,779,260 B1 | 8/2004 | Brandenburg et al. | |
| 7,148,127 B2 * | 12/2006 | Oohata et al. | 438/469 |
| 2002/0131251 A1 * | 9/2002 | Corisis et al. | 361/760 |
| 2002/0163006 A1 * | 11/2002 | Yoganandan et al. | 257/81 |
| 2002/0186549 A1 * | 12/2002 | Bolken | 361/737 |
| 2004/0190238 A1 | 9/2004 | Hubbard | |
| 2007/0005839 A1 | 1/2007 | Foehringer et al. | |

FOREIGN PATENT DOCUMENTS

| | | | |
|---|---|---|---|
| JP | 2003-029656 | * | 1/2003 |
| JP | 2003-060242 | * | 2/2003 |

OTHER PUBLICATIONS

A Simple Surface-Emitting LED Array Useful for Developing Free-Space Optical Interconnect, paper, by H.F. Bare et al IEEE Photonics Technology Letters, vol. 5, No. 2, Feb. 1993, p.172-175.*
"Non-Final Office Action mailed Sep. 19, 2007 in U.S. Appl. No. 11/173,217", 20 pages.
"U.S. Appl. No. 11/173,217 Response filed Feb. 19, 2008 to Non-Final Office Action mailed Sep. 19, 2008", (Feb. 19, 2008),20 pages.
"Non-Final Office Action mailed Sep. 19, 2008 in U.S. Appl. No. 11/173,217", 20.

* cited by examiner

*Primary Examiner*—C. J Arbes
(74) *Attorney, Agent, or Firm*—Schwegman, Lundberg & Wossner, P.A.

(57) ABSTRACT

A method includes populating a circuit board with components, and encapsulating the circuit board and the components with a material. The method further includes separating the circuit board into a plurality of separate devices.

18 Claims, 9 Drawing Sheets

)# PACKAGING METHOD FOR CIRCUIT BOARD

TECHNICAL FIELD

The inventive subject matter is related to a packaging method and apparatus for electronic devices.

BACKGROUND INFORMATION

One form of package includes a substrate, such as a printed circuit card, populated with various surface mount technology components. The surface mount technology components are picked and placed onto the substrate or printed circuit board. The surface mount technology components are electrically coupled to the substrate or printed circuit board using a solder reflow process. Once the substrate or printed circuit board is populated, the printed circuit board and attached surface mount technology components are placed within a plastic clam shell case to complete the product. The plastic clam shell case is used to enclose a substrate, such as a printed circuit board. One problem is that clearance must be provided between the clam shell and the populated printed circuit board. This clearance adds to the volume of space needed for the product.

In some instances, it is desirable for a component on the substrate to be viewable from outside the clam shell case. For example, a light emitting diode (LED) can be provided as a surface mount component. When an LED is used to indicate a condition that is of interest to the end user, such as power on to the part, the LED must be viewable from outside the clam shell case. This requires forming an opening in the case and also requires alignment of the opening and the LED to allow the end user to view the LED from the outside of the case.

Another problem relates to labeling. Labeling can be done in several different ways. One labeling method includes printing on the exterior surface of the substrate or printed circuit board. In other products, a separate label is applied to the exterior of the clam shell case or to the exterior of the substrate. The separate labels on an exterior surface can be easily removed or may wear off. In addition, labels printed on an exterior surface can also wear off. If the label wears off or is removed, most times it is difficult to identify the part. This can be a problem for end users as well as manufacturers that use feedback regarding the parts to determine faults in their manufacturing process.

Currently, the printed circuit board or substrate is formed in its final size and then populated with surface mount technology components before placing the populated substrate into the clam shell case. Manufacturing testing must be done on a per part or per circuit board basis. Many manufacturing lines are testing 100 percent of their parts. This scheme requires the dedication of a large amount of the manufacturing resources to the testing process.

BRIEF DESCRIPTION OF THE DRAWINGS

Embodiments of the invention are pointed out with particularity in the appended claims. However, a more complete understanding of the inventive subject matter may be derived by referring to the detailed description when considered in connection with the figures, wherein like reference numbers refer to similar items throughout the figures, and:

The description set out herein illustrates various embodiments of the invention, and such description is not intended to be construed as limiting in any manner.

DETAILED DESCRIPTION

In the following detailed description of the preferred embodiments, reference is made to the accompanying drawings that form a part hereof, and in which are shown by way of illustration specific embodiments in which the inventive subject matter can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of the inventive subject matter. The following detailed description, therefore, is not to be taken in a limiting sense, and the scope of various embodiments of the invention is defined only by the appended claims, along with the full range of equivalents to which such claims are entitled.

Figure 1:
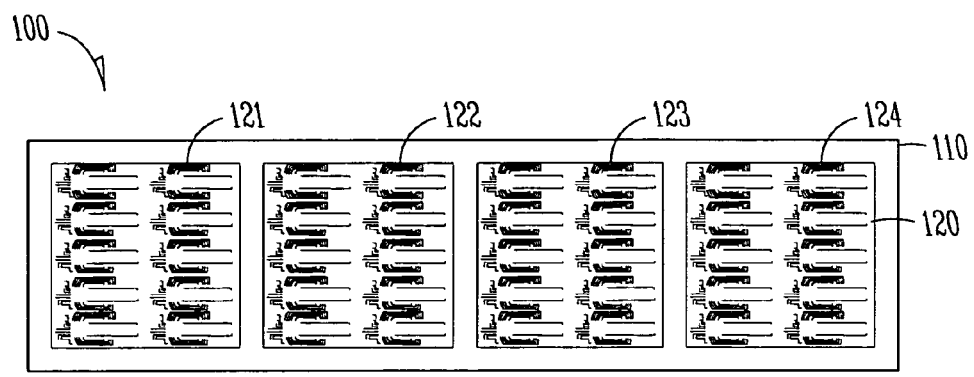
FIG. 1 is a top view of an assembly panel, according to an example embodiment.

FIGS. 1 through 12 illustrate various steps in forming a device according to an example embodiment. FIG. 1 is a top view of an assembly panel 100 according to an example embodiment. The assembly panel 100 includes a substrate 110 that includes a plurality of bonding sites 120. The bonding sites 120 are for electrical bonding of components to conductors within the substrate 110. As shown in FIG. 1, the bonding sites are grouped into four different areas 121, 122, 123, and 124. Each group of bonding sites 121, 122, 123, and 124 includes circuits and conductors that will be associated with a plurality of different devices within the grouping of landing sites 121, 122, 123, and 124. In some embodiments of the invention, the groupings 121, 122, 123, and 124 of landing sites 120 can include various numbers of different devices, or can include different types of devices within a grouping 121, 122, 123, and 124. In still other embodiments each group of group 121, 122, 123, and 124 of bonding sites 120 can include a single device.

Figure 2:
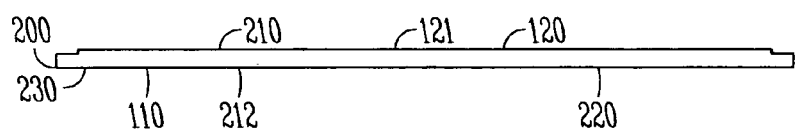
FIG. 2 is a side view of a portion of the assembly panel of FIG. 1, according to an example embodiment.

FIG. 2 is a side view of a portion of the assembly 100 shown in FIG. 1, according to an example embodiment. The portion 200 shows the substrate 110. The substrate 110 includes a first major surface 210 and a second major surface 212. The portion of the substrate 110 shows that the first major surface includes bonding sites 120 from the group of bonding sites 121. FIG. 2 also shows that the substrate includes an electrical contact 230 on the second major surface 212 of the substrate 110. Electrical conductors 220 are also positioned within the substrate 110; although not shown, the substrate could also include openings that are lined with conductive materials such as through holes for connecting conductors on the first major surface 210 to the conductors or connectors on the second major surface 212. As shown in FIGS. 1 and 2, the substrate 110 of the package assembly 100 can be in the form of a printed circuit card.

Figure 3:
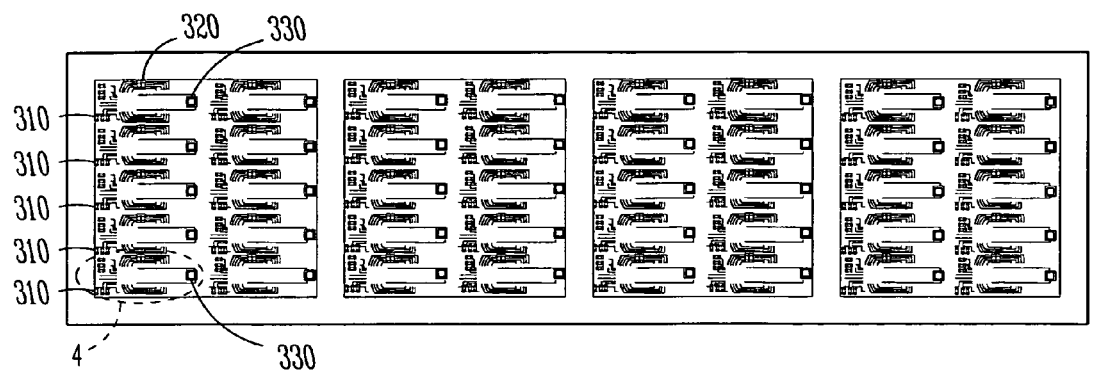
FIG. 3 is a top view of an assembly panel after packaged electrical components have been solder attached, according to an example embodiment.
Figure 4:
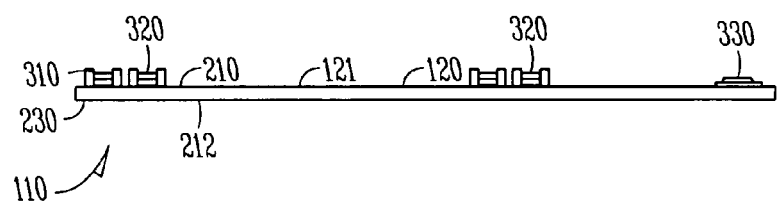
FIG. 4 is a side view of a portion of the assembly panel of FIG. 3 after packaged electrical components have been solder attached, according to an example embodiment.

FIG. 3 is a top view of the assembly panel 100 after packaged electrical components have been solder attached, according to an example embodiment. FIG. 4 is a side view of a portion the assembly panel 100 of FIG. 3 after packaged electrical components have been solder attached, according to an example embodiment. Now looking at both FIGS. 3 and 4, the next step in the various steps for forming a device will be discussed. A pick and place machine is used to place packaged electrical components such as resistors, capacitors, and light emitting diodes (LEDs) on to bonding sites 120 associated with the first group of bonding sites on substrate 110. As shown in FIGS. 3 and 4, resistors carry a reference numeral 310, capacitors carry a reference numeral 320 and LEDs carry a reference numeral 330. As shown in FIG. 3 there are a number of devices that carry substantially identical resistors 310 and a number of devices that carry substantially identical capacitors 320 and that carry substantially identical LEDs 330. The pick and place machine places these electrical components 310, 320, 330 onto the electrical conductors or bonding sites 120 on the substrate 110. The electrical components 310, 320, 330 are then attached to the bonding sites 120 by a solder reflow process. As a result, each of the individual devices on the substrate 110 have been populated with the packaged electrical components necessary to form the individual devices.

Figure 5:
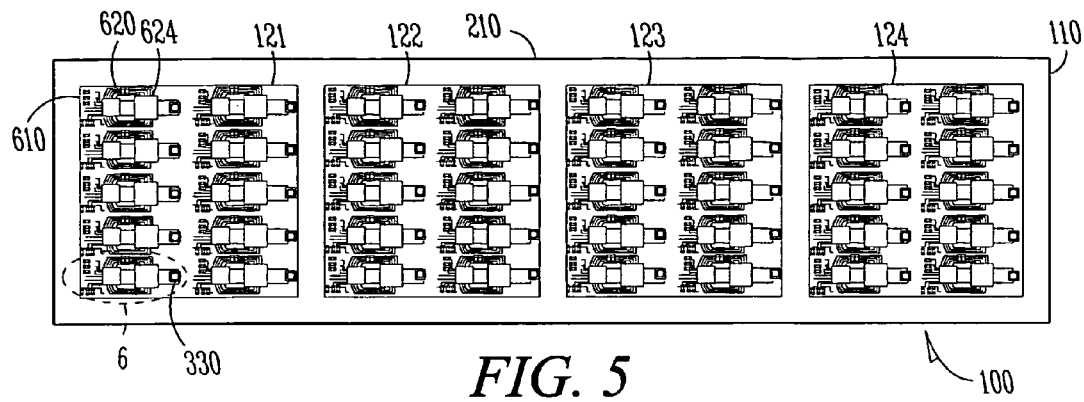
FIG. 5 is a top view of an assembly panel after bare die are attached and wire bonded, according to an example embodiment.
Figure 6:
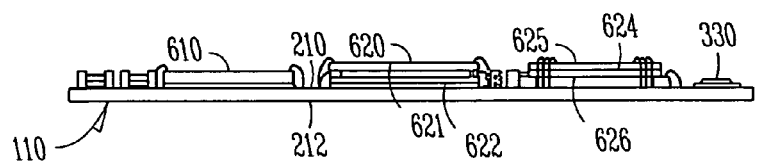
FIG. 6 is a side view of a portion of an assembly panel of FIG. 5 after bare die are attached and wire bonded, according to an example embodiment.

FIG. 5 is a top view of an assembly panel 500 after bare dice have been attached and wire bonded to the substrate 110. FIG. 6 is a side view of a portion of the assembly panel of FIG. 5 after the bare dice have been attached and wire bonded to the substrate 110, according to an example embodiment. Now referring to both FIGS. 5 and 6, the next step of forming devices will be discussed. Groups 121, 122, 123, 124 of bonding sites 120 are populated with a controller 610 and a first set of memory 620 and a second set of memory 624. The first set of memory 620 may include a first memory chip 621 and a second memory chip 622 stacked on to the first major surface 210 of the substrate 110. The second set of memory 624 also may include a stack of memory elements 625, 626. It should be noted that memory may also be placed on the first major surface 210 of the substrate 110 as triple stacks of memory chips or as a single memory chip, in other embodiments of the invention. Furthermore, it should be noted that the substrate can be any type of substrate and there can be any number of clips attached on the substrate. The controller 610 may be a microprocessor or a dedicated microcontroller for doing specific tasks. The bare die components are attached and then wire bonded to the bonding sites 120. As shown in FIGS. 5 and 6, the substrate 110 is fully populated with packaged electrical components and bare die devices such as the controller 610 and the sets of memory 620, 624. The contacts or bonding sites 120 as well as the electrical conductors associated with the substrate form the circuit or circuits associated with particular individual devices.

Figure 7:
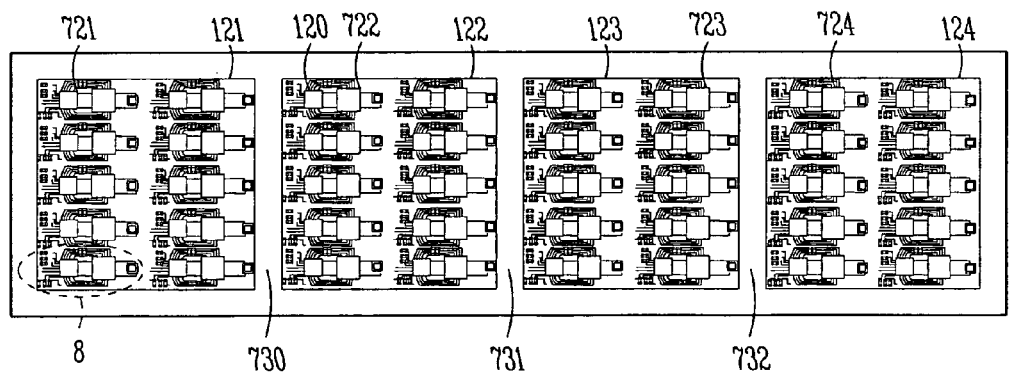
FIG. 7 is a top view of the assembly panel after over-molding, according to an example embodiment.
Figure 8:
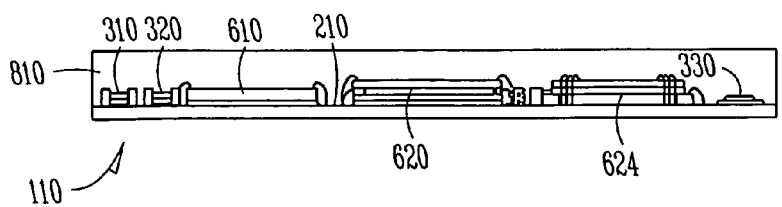
FIG. 8 is a side view of a portion of the assembly panel of FIG. 7 after over-molding, according to an example embodiment.

FIG. 7 is a top view of an assembly panel 100 after encapsulating the components, according to an example embodiment. FIG. 8 is a side view of a portion of the assembly panel 100 after encapsulating the components, according to an example embodiment. Encapsulation of the components can be done by overmolding the components, glob topping, injection molding or any other encapsulation method. In the following example embodiment, overmolding is used. Now referring to both FIGS. 7 and 8, the next step in forming a number of devices will be discussed. The package assembly 100 is then placed into a mold (not shown). The mold includes clamps which clamp the edges of the package assembly 100 as well as the portions of the substrate 110 between the first group of bonding sites 121, the second group of bonding sites 122, the third group of bonding sites 123, and the fourth group of bonding sites 124. The bonding sites or groups of bonding sites form groups of individual electrical devices that have been formed on the substrate 110. More specifically, the groups of bonding sites, as now populated, form groups of individual devices 721, 722, 723, and 724. The mold includes clamps that are positioned in a street 730 and in a street 731 and in a street 732. Street 730 occurs between the group of individual devices 721 and the group of individual devices 722. Street 731 occurs between the group of individual devices 722 and the group of individual devices 723. Street 732 occurs between the group of individual devices 723 and the group of individual devices 724.

An encapsulating material such as an overmold material is placed into the mold. The overmold material, as seen in FIG. 8, is placed on the first major surface 210 of the substrate 110 and envelopes or encompasses or covers all of the electrical components, including the resistors 310, the capacitors 320, and the LEDs 330. An overmold material 810 may also cover the microprocessor or microcontroller 610, the first memory set 620, and the second memory set 624. Thus, as shown in FIGS. 7 and 8, the assembly panel 110 includes a plurality of devices that are in groups of devices 721, 722, 723, and 724. Each of the particular groups of devices 721, 722, 723, and 724, are covered with an overmold material 810 after an overmolding process. The overmold material 810 can include but is not limited to thermoplastic, polypropylene, polyurethane, polyethylene, thermal plastics, silicon elastomers and the like. In some embodiments the overmold or encapsulating material is opaque. In other embodiments clear plastic or translucent materials can also be used. The overmolding process can include injection molding or transfer molding or a similar type of molding operation. It should be noted that the assembly panels 110 can be seen in a mold 1600 in FIGS. 16-18 will further discuss the overmolding process.

Figure 9:
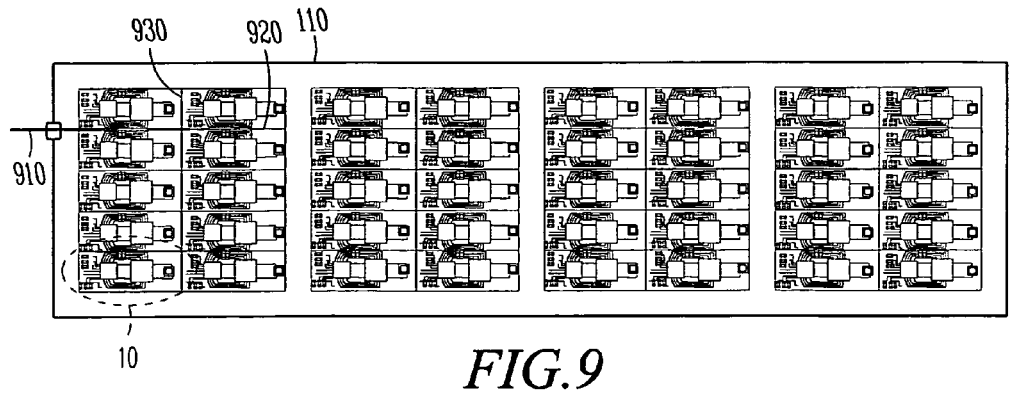
FIG. 9 is a top view of the assembly panel during singulation, according to an example embodiment.

FIG. 9 is a top view of an assembly panel 100, as it is being singulated, according to an example embodiment. Singulation is merely separating the various individual devices form from one another to form a plurality of finished parts. A saw 910 is shown in FIG. 9. The saw 910 cuts the assembly panel 110 into a plurality of individual devices. The saw 910 cuts along cut lines, such as vertical cut lines 920 and horizontal cut lines 930. The end result is an individual or finished part as shown in FIG. 10.

Figure 10:
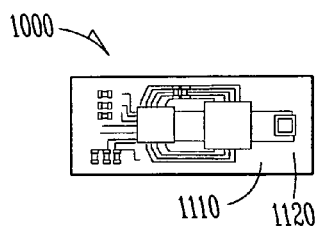
FIG. 10 is a top view of an individual device resulting from singulation of the assembly panel, according to an example embodiment.
Figure 11:
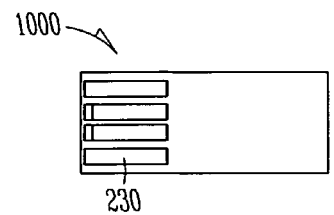
FIG. 11 is a bottom view of an individual device resulting from singulation of the assembly panel, according to an example embodiment.
Figure 12:
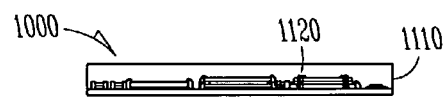
FIG. 12 is a cutaway side view of an individual device resulting from singulation of the assembly panel, according to an example embodiment.

FIGS. 10, 11, and 12 are a top view, a bottom view, and a cutaway side view of an individual device 1000 resulting from singulation of the assembly panel 110 (shown in FIGS. 1, 3, 5, 7 and 9), according to an example embodiment. Now referring to FIGS. 10, 11, and 12, the finished part or individual device 1000 will be discussed. The individual device 1000 includes various electrical components including packaged electrical components and/or dielectrical components, which are encapsulated within a substrate 1110, and the overmolded portion 1120 of the individual device 1000. The individual device 1000 also includes a bottom surface that includes connectors, such as connector 230.

Figure 13:
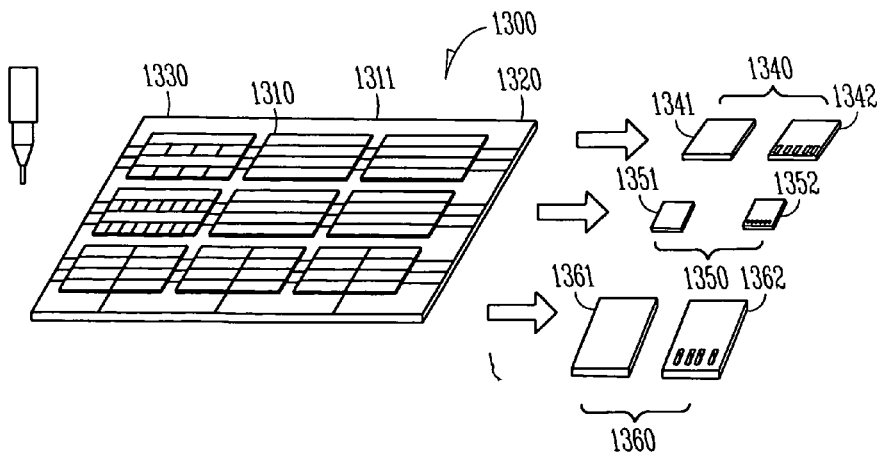
FIG. 13 is a perspective view of an overmolded assembly panel that yields several types of different individual devices, according to an example embodiment.

FIG. 13 is a perspective view of an overmolded assembly panel 1300 that yields several types of different individual devices, according to an example embodiment. The assembly panel 1300 is formed in the same way as the assembly panel 100 (as detailed in FIG. 1 through 12). In short, the assembly panel 1300 includes a substrate 1310 that includes a series of electrical contacts or bonding sites. The substrate 1310 also includes electrical conductors within the substrate as well as electrical contacts or connectors on a second major surface of the assembly panel. The first major surface 1311 is populated with packaged electrical components which are attached to the substrate 1310 using a solder reflow process. It should be noted that other methods can also be used to electrically connect components including conductive epoxy, thermosonic bonding, thermo-compression bonding, tape automated bonding, flip chip bonding and the like. Also attached to the first major surface 1311 of the substrate 1310 are bare die components which are wire bonded to the bonding sites. The various individual devices are grouped and then portions of the assembly panel 1300 is overmolded.

The assembly panel 1300 is then singulated, or separated along the various cut lines shown, such as horizontal cut lines 1320, and vertical cut lines 1330. The end result of singulation yields three different types of individual devices or finished parts. The finished parts or individual devices include a device 1340 which has a top surface 1341, and a bottom surface 1342, an individual device 1350 that includes a top surface 1351, and a bottom surface 1352, and an individual device 1360 that includes a top surface 1361, and a bottom surface 1362. It should be noted that an assembled panel can include any number of individual parts or individual devices.

In one embodiment of the invention, the individual devices are spaced apart from one another such that the cut lines can be moved to accommodate different form factors for the same device. Thus, by cutting along one set of cut lines, a first form factor will be obtained and by cutting along the second set of cut lines, a second form factor of an individual device can be obtained. In each device, only the form factor will differ. The circuit associated with the device will be substantially the same.

Figure 14:
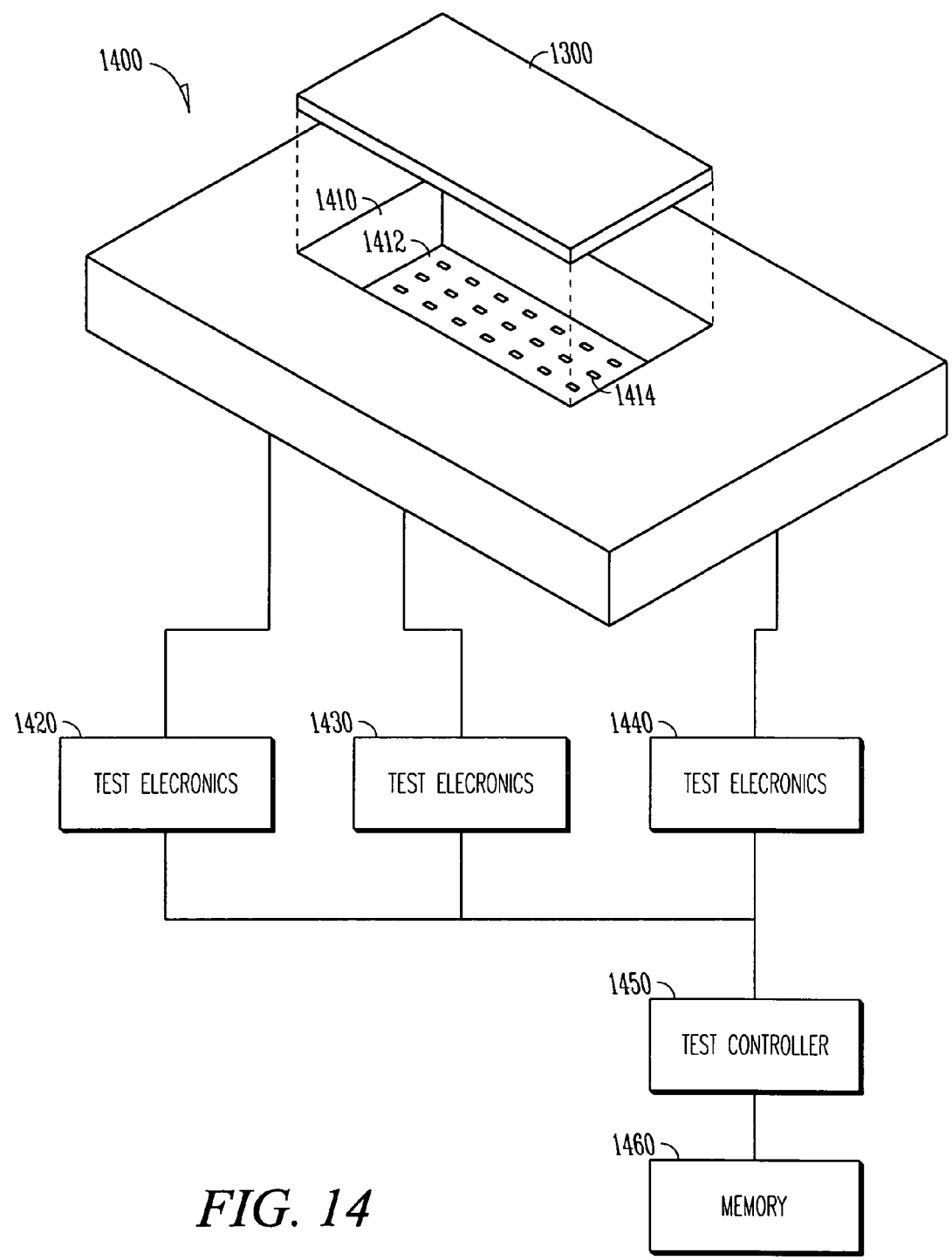
FIG. 14 is a schematic view of a testing apparatus for an overmolded assembly panel, according to an example embodiment.

FIG. 14 is a schematic view of a testing apparatus 1400 for an assembly panel 100, 1300, according to an example embodiment. As shown in FIG. 14, the assembly panel 1300 is the device under test. It should be noted that any assembly panel, including the assembly panel 100, could also be the device under test. The testing apparatus 1400 includes a nest 1410. The nest 1410 includes a bottom surface or a surface 1412 that includes a plurality of electrical contacts or probes 1414 which are positioned to make electrical contact with the electrical contacts of the various devices on the assembly panel 1300. In other words, the contacts are on the non-overmolded side of the printed circuit board. The probes 1414 are connected to various sets of test electronics, such as test electronics 1420, test electronics 1430, and test electronics 1440. The test electronics 1420 can be for testing a first type of individual devices or finished parts that are still on the assembly panel 1300. The test electronics 1430 can be test electronics for testing the various individual devices associated with the second group or type of individual finished products which are still on the assembly panel 1300. The test electronics 1440 are for testing a third type or a third set of individual devices or finished parts which are still resident on the assembly panel. The assembly panel 1300 is fully engaged with the nest 1410 so that the probes 1414 in the bottom surface 1412 of the nest contact the various contacts associated with the assembly panel 1300. The test electronics 1420, 1430, and 1440 can test the various individual devices while they are still resident on the assembly panel 1300, and before the assembly panel 1300 is singulated to yield a plurality of individual devices.

It should be noted that each set of test electronics 1420, 1430, 1440 can be used to test individual devices in a serial fashion or in a parallel fashion. For example, if an assembly panel 1300 has twenty individual devices that are to be tested by the test electronics 1420, the test electronics 1420 can be configured so that each of the twenty individual devices are tested in serial. For example, a first individual device is tested and then a second individual device is tested, and so on. In another embodiment, the test electronics 1420 can be configured to provide parallel testing of each of the twenty individual devices. For example, the test electronic configured for parallel testing will test all twenty individual devices associated with the assembly panel 1300 substantially at the same time. The parallel configuration, of course, provides for a higher throughput for testing assembly panels, such as the assembly panel 1300.

The test electronics 1420, 1430, 1440 are each attached to a test controller 1450. The test controller 1450 includes instructions for sequencing the various test electronics 1420, 1430, 1440. Communicatively coupled to the test controller 1450 is memory 1460. The memory is used to store test results for each of the individual devices or finished parts on the assembly panel 1300. The location of the individual devices or finished parts is also stored so that after the assembly panel 1300 is singulated into individual finished parts or individual devices, the particular devices that may have failed the test or performed at a lesser level can be either removed or graded accordingly.

Figure 15:
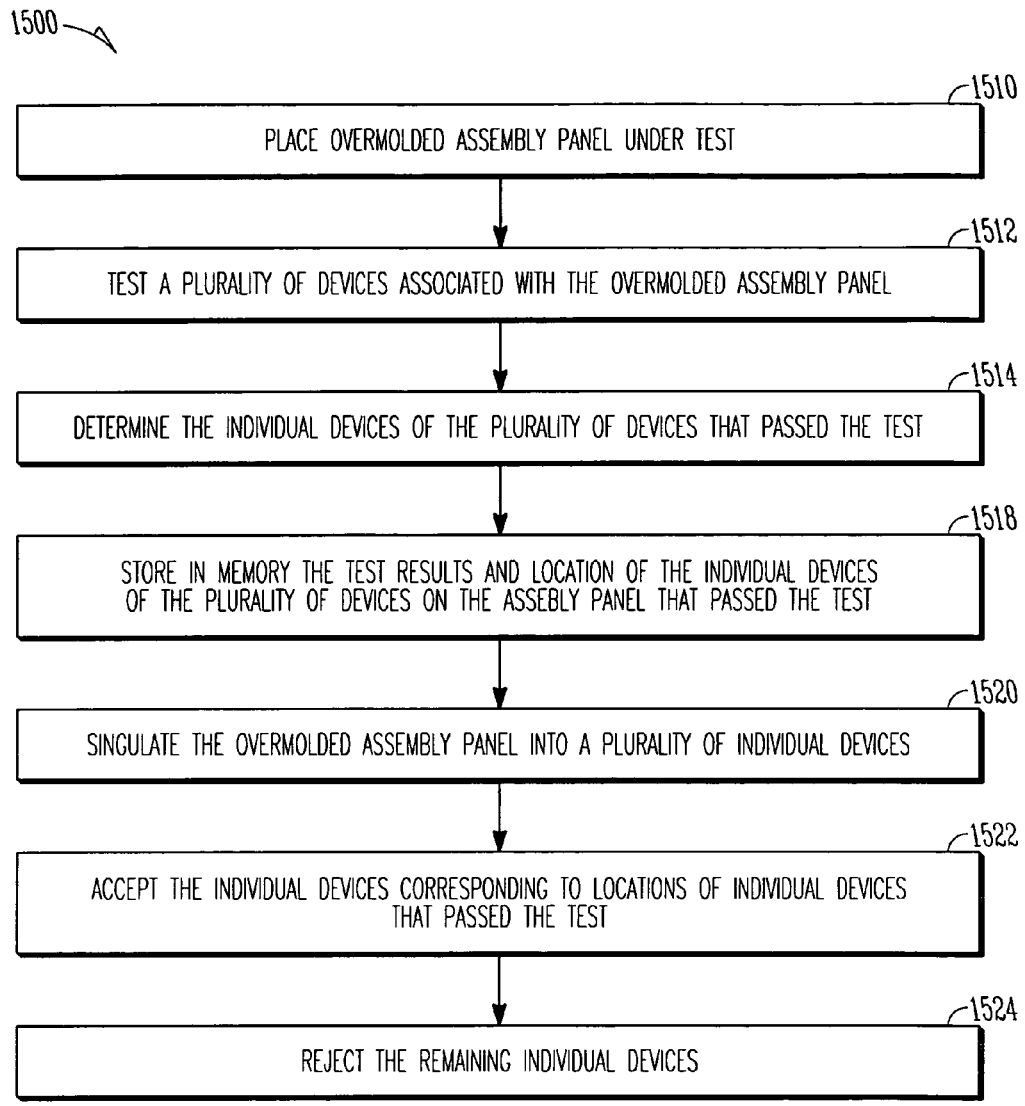
FIG. 15 is a flow diagram of a method for testing of individual devices on an assembly panel, according to an example embodiment.

FIG. 15 is a flow diagram of a method 1500 for testing of individual devices on an assembly panel 1300, 100, according to an example embodiment. Initially, an overmolded assembly panel is placed into a testing apparatus, such as testing apparatus 1400, as a device under test, as depicted by reference numeral 1510. The plurality of devices associated with the overmolded assembly panel are then tested, as depicted by reference numeral 1512. In other words, the overmolded assembly panel includes a plurality of devices and the testing is done prior to singulating the overmolded assembly panel into the individual devices. The individual devices of the plurality of devices that pass the test is then determined, as depicted by reference numeral 1514. The test results and the location of the individual devices on the assembly panel that pass the test are then stored in memory, as depicted by reference numeral 1518. The overmolded assembly panel is then singulated into the plurality of individual devices, as depicted by reference numeral 1520. The individual devices correspond to locations of individual devices that pass the test are then accepted, as depicted by reference numeral 1522 and the remaining individual devices are rejected, as depicted by reference numeral 1524. In some embodiments of the invention, the individual devices associated with the panel assembly can be graded and the locations and grades of the individual devices can be stored so that the individual devices can be grouped with other devices having the same grade after the assembly panel 100, 1300 is singulated into the individual devices. In still other embodiments of the invention, the individual devices that are rejected can also have their locations stored in memory. This may be particularly useful when all of the devices on the assembly panel 1300, 100 are of the same type or substantially identical after singulating the assembly panel 1300, 100.

Figure 16:
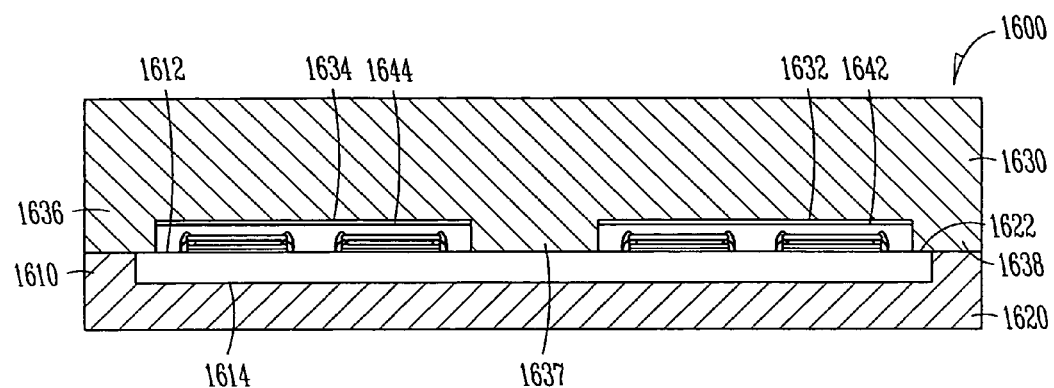
FIG. 16 is a side view of a mold for overmolding a panel assembly, according to an example embodiment.

Now turning to FIGS. 16-18, an example embodiment of the overmolding process will be discussed. FIG. 16 is a side view of a mold 1600 for overmolding a panel assembly 1610, according to an example embodiment. The panel assembly 1610 includes a first major surface 1612, and a second major surface 1614. The first major surface 1612 of the assembly panel 1610 is populated with electrical components including bare die and packaged electrical components. The mold 1600 includes a first portion 1620, and a second portion 1630. The first portion of the mold 1620 includes an opening 1622 therein which is sized to receive the assembly panel 1610. The opening 1622 is dimensioned to receive the assembly panel 1610. The second major surface 1614 of the assembly panel 1610 is positioned adjacent the opening 1622 and the first portion 1620 of the mold 1600. The second portion of the mold 1630 includes openings 1632 and 1634 therein. The opening 1632 and 1634 are the portion of the mold 1600 which receives the overmold material. Therefore the openings 1632 and 1634 have sufficient draft to allow removal of the overmolded panel assembly from the mold 1600. The openings 1632 and 1634 also include a release material to enable or to help the mold portion 1630 release from the first major surface 1612 after overmolding has taken place.

As shown in FIG. 16, the openings 1632 and 1634 include a labeling sheet 1642 and 1644. The labeling sheets 1642 and 1644 correspond to labels that identify the individual devices of the assembly panel 1610. Therefore, the labels include identifying information such as the company name and a part number; other identifying information can also be included on the sheet. In one embodiment of the information the labels 1642 and 1644 actually are sheets that include multiple labels which are placed in the major surface of the openings 1634 and 1632. The sheets having multiple labels include identifying information that corresponds to the individual devices that are underneath the labels. In one embodiment of the invention the labeling sheets 1644, 1642 are also made of a release material. The second portion of the mold 1630 also includes legs 1636, 1637 and 1638. The legs 1636, 1637, 1638 also serve to clamp the assembly panel 1610 within the mold.

Once the assembly panel 1610 is clamped within the mold 1600, an overmold material is placed into the opening 1632 and 1634 in the second mold portion 1630. The mold material can be injected into the opening 1632 or 1634. In another embodiment of the invention, overmolding is provided by transfer molding. After the overmolding material is injected into the opening 1632, 1634 and allowed to cool, an overmolded assembly panel 1710 is removed from the mold.

Figure 17:
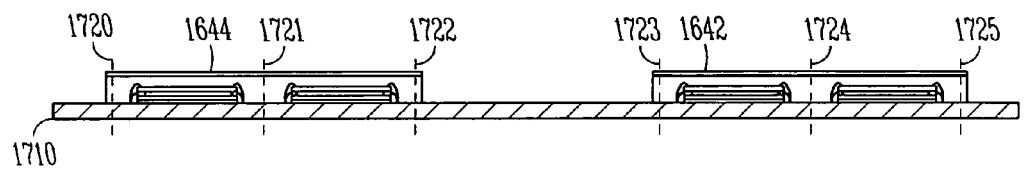
FIG. 17 is a side view of an overmolded panel assembly that includes labels therein, according to an example embodiment.

FIG. 17 is a side view of the overmolded panel assembly 1700 that includes labels or label sheets 1644, 1642 therein, according to an example embodiment. The labels or label sheets 1644, 1642 are embedded into the overmolded portion and becomes a permanent part of the final assembly. In one embodiment, the labels or label sheets are placed into the mold. The assembly panel 1710 is then singulated along cut lines 1720, 1722, 1723, 1724, 1725, and 1726 and singulated with cuts in another direction to form individual parts, such as a final part 1810.

Figure 18:
FIG. 18 is a perspective view of a set of individual devices resulting from singulating the overmolded panel assembly of FIG. 17, according to an example embodiment.

FIG. 18 is a perspective view of a set of individual devices resulting from singulating the overmolded assembly of FIG. 17, according to an example embodiment. Each individual device 1810 is substantially the same and therefore only one will be described in detail for the sake of brevity. Each individual part includes an embedded label 1844. The label is embedded in an overmolding material 1840. Also embedded in the overmolding material 1840 are the electronics as depicted by reference numeral 1820. The entire assembly rests upon a portion of the substrate formerly from the panel assembly 1610. The labels 1844 are aligned to the edge of the part automatically since the label is singulated at the same as the part is. Including the label or a panel of labels in the mold 1600 also decreases the assembly time since individual labels do not have to be placed on individual parts. In addition, in an example embodiment where the labeling sheet is also a release material, the costs associated with manufacturing can be lowered since the label serves a dual purpose so the cost of manufacturing is reduced since either the cost of the labeling is reduced, or the cost of the release material is eliminated.

Figure 19:
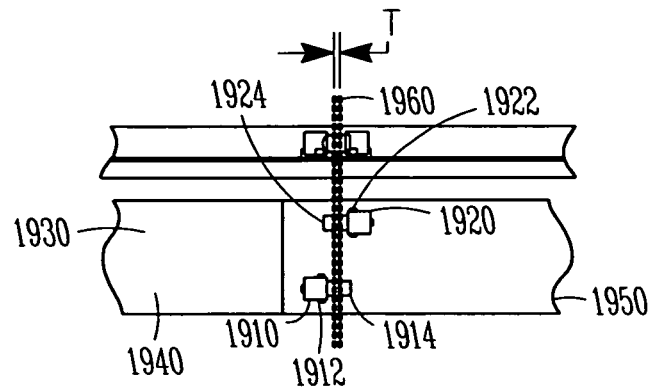
FIG. 19 is a top view of an overmolded pair of LEDs as placed on an assembly panel, according to an example embodiment.
Figure 20:
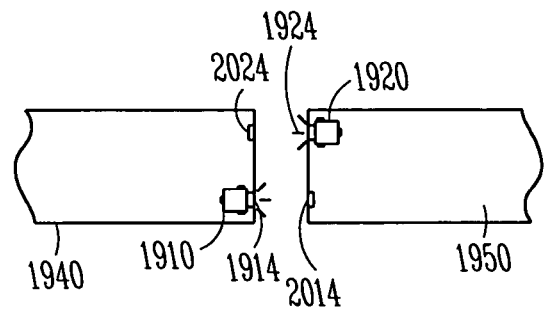
FIG. 20 is a top view of an overmolded pair of LEDs after the assembly panel in FIG. 19 has been singulated or separated into a pair of devices, according to an example embodiment.
Figure 21:
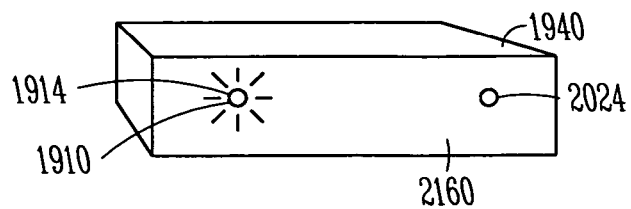
FIG. 21 is a perspective view of one the edge of one of the singulated devices from FIG. 20, according to an example embodiment.

The overmold material can be either a clear plastic or can be an opaque, or colored, material that may block or substantially inhibit the transmission of light from an LED. Many of the devices these days include LEDs and, therefore, including LEDs into a device so that the LED is visible, will now be discussed. FIGS. 19-21 discuss a first example embodiment for manufacturing an overmolded assembly panel, while the FIGS. 22-25 discuss a second example embodiment for fabricating a plurality of parts onto an assembly panel using LEDs.

FIG. 19 is a top view of an overmolded pair of LEDs 1910, 1920, as placed on an assembly panel 1930. The first LED 1910 is associated with the first device 1940, and the second LED 1920, is associated with a second device 1950. The first LED 1910 includes a reflector 1912 and a lens 1914. Similarly the second LED 1920 includes a reflector 1922 and a lens 1924. Also shown in FIG. 19 is a cut line or kerf 1960, that is depicted as two dotted lines, separated by an amount of tolerance, or tolerance range "T".

FIG. 20 is a top view of the overmolded pair of LEDs 1910 and 1920, after the assembly panel 1930 has been singulated or cut or separated into a pair of devices 1940, 1950, according to an example embodiment. The separate devices 1940 and 1950 have been singulated along the line 1960 within the tolerance range provided. The end result is that each LED is now associated with a different individual device. For example, LED 1920 is associated with individual device 1950 and LED 1910 is associated with individual device 1940. The LED reflector and main body 1910 is associated with individual device 1940, and the main body and reflector of 1920 is associated with individual device 1950. The result of singulation is shortening, or cutting off a portion of the lens of each of the LEDs. For example, LED 1910 now has a shortened lens 1914. Individual device 1950 now includes a leftover lens portion 2014. Similarly individual device 1950 now carries a shortened lens 1924 and the individual device 1940 includes a leftover portion of the lens which is depicted by reference numeral 2024.

FIG. 21 is a perspective view of one the edges of one of the singulated devices 1940 (shown in FIG. 19) from FIG. 20, according to an example embodiment. The edge shown is the edge 2160, formed by singulating or separating the individual parts along lines 1960 (shown in FIG. 19). Along edge 2160 the individual device 1940 includes an active LED 1914 that projects light through the lens 1914. The edge 2160 of the individual device 1940 also includes an inactive lens portion 2024.

Figure 22:
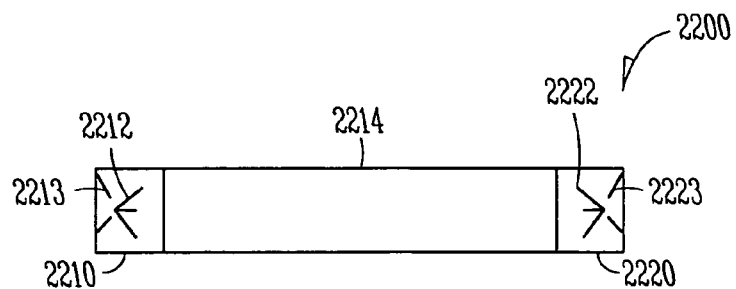
FIG. 22 is a schematic view of a pair of LEDs that share a lens, according to an example embodiment.

Now referring to FIGS. 22-25, another embodiment for handling LEDs will be discussed. FIG. 22 is a schematic view of a device 2200 that includes a first LED 2210, and a second LED 2220, as well as a shared or common lens 2214. The LED 2210 includes a reflector 2212, as well as the electrical connection to the LED itself, as depicted by reference numeral 2213. The LED 2220 also includes a reflector 2222 and the leads or electrical connections 2223. The device 2200 can also be termed as a double-ended LED.

Figure 23:
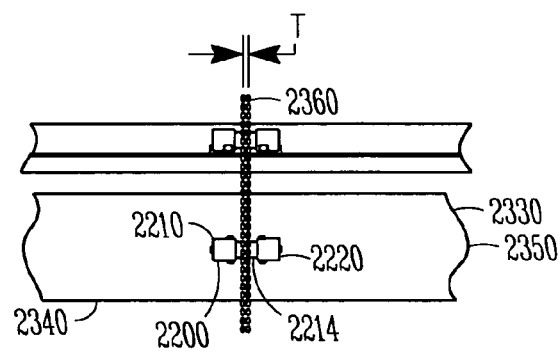
FIG. 23 is a top view of an overmolded pair of LEDs that share a lens as placed on an assembly panel, according to an example embodiment.

FIG. 23 shows the double-ended LED device 2200 placed on a substrate 2330 that includes a first individual device 2340 and a second individual device 2350. Each of the LEDs 2210 and 2220 are electrically connected to their respective individual devices 2340 and 2350. Also shown in FIG. 23 is a cut line 2360 depicted as a pair of dotted double lines, separated by a tolerance range depicted with "T".

Figure 24:
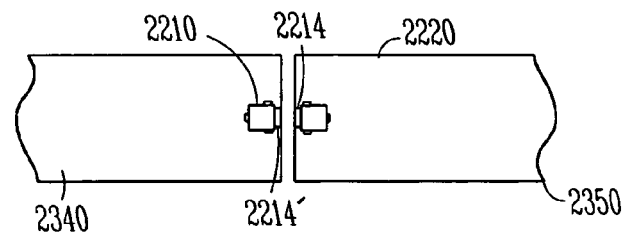
FIG. 24 is a top view of an overmolded pair of LEDs that share a lens after the assembly panel in FIG. 23 has been singulated or separated into a pair of devices, according to an example embodiment.

FIG. 24 is a top view of an overmolded pair of LEDs 2210 and 2220 after the assembly panel 2330 of FIG. 23 has been singulated or separated into a pair of individual devices 2340, 2350, according to an example embodiment. After singulation the lens 2214 has been divided into a first lens portion 2214 and a second lens portion 2214 prime is associated with the LED 2210 and individual device 2340 while the other lens portion 2214 is now associated with LED 2220 that is associated with individual device 2350.

Figure 25:
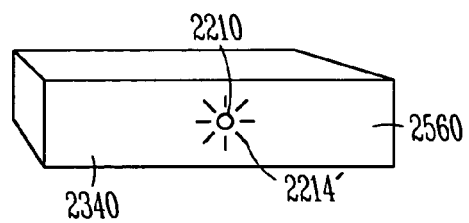
FIG. 25 is a perspective view of one of the edge of one of the singulated devices from FIG. 24, according to an example embodiment.

FIG. 25 is a perspective view of one edge 2560 of the singulated device 2340 from FIG. 24, according to an example embodiment. The LED 2210 is viewable along edge 2560 through lens 2214 for individualized part or individual device 2314. As shown in FIG. 25, there is no leftover LED lens in the edge 2560 of the individual device 2314. The double-ended LED device 2200 is necessary to prevent leftover lens portions from showing up along the cut edges of the individual devices, such as device 2314.

The foregoing description of the specific embodiments reveals the general nature of the inventive subject matter sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the embodiments of the invention are intended to embrace all such alternatives, modifications, equivalents and variations as fall within the spirit and broad scope of the appended claims.

What is claimed is:

1. A method comprising:
   populating a circuit board with components;
   encapsulating the circuit board and the components with a material; and
   separating the circuit board into a plurality of separate devices, wherein populating the circuit board with components includes placing a light emitting diode and lens attached to the light emitting diode on the circuit board, and wherein separating the circuit board includes removing a portion of the lens attached to the light emitting diode.

2. The method of claim 1 further comprising:
   testing the devices before the devices are separated.

3. The method of claim 2 further comprising accepting the separate devices that passed a selected test.

4. The method of claim 1 wherein populating the circuit board further comprises electrically attaching a die to the circuit board.

5. The method of claim 1 wherein encapsulating the circuit board and the components with the material includes injection molding.

6. The method of claim 1 wherein encapsulating the circuit board and the components with the material includes transfer molding.

7. The method of claim 1 wherein encapsulating the circuit board includes overmolding.

8. The method of claim 1 wherein encapsulating the circuit board includes glob topping.

9. The method of claim 1 wherein separating the circuit board into the plurality of separate devices includes changing the cuts of the circuit board to change the form factor of the device.

10. The method of claim 1 wherein encapsulating the circuit board and the components with the material includes placing a label into a mold.

11. The method of claim 10 wherein the label acts as a release material.

12. A method comprising:
    populating a circuit board with components;
    encapsulating the circuit board and the components with a material; and
    separating the circuit board into a plurality of separate devices, wherein populating the circuit board with components includes placing a light emitting diode and lens attached to the light emitting diode at a package edge on a circuit board, wherein separating the circuit board includes singulating the circuit board along a package edge to form a package, and wherein a portion of the lens attached to the light emitting diode is removed.

13. A method comprising:
populating a circuit board with components, wherein populating the circuit board includes placing a light emitting diode and lens attached to the light emitting diode on the circuit board;
encapsulating the circuit board and the components with a material, wherein encapsulating the circuit board and the components with the material includes placing a plurality of labels into a mold; and
singulating the encapsulated circuit board into a plurality of devices, wherein the labels include identifying information for at least some of the individual devices, and wherein singulating the circuit board includes removing a portion of the lens attached to the light emitting diode.

14. A method comprising:
populating a circuit board with components, wherein at least one of the components includes:
a first light emitting diode;
a second light emitting diode; and
a lens attached between the first light emitting diode and the second light emitting diode; and
singulating the circuit board and the lens to form a plurality of components.

15. The method of claim 14 further comprising encapsulating the first light emitting diode, the second light emitting diode and the lens.

16. The method of claim 14 further comprising:
electrically connecting a first light emitting diode to a first device; and
electrically connecting a second light emitting diode to a second device.

17. The method of claim 16 further comprising separating the circuit board into a first device and a second device, wherein separating the circuit board into a first device and a second device includes cutting the lens attached between the first light emitting diode and the second light emitting diode.

18. The method of claim 17 further comprising testing the first device and the second device while on the populated circuit board.

* * * * *

UNITED STATES PATENT AND TRADEMARK OFFICE
CERTIFICATE OF CORRECTION

PATENT NO. : 7,533,457 B2  Page 1 of 1
APPLICATION NO. : 11/173219
DATED : May 19, 2009
INVENTOR(S) : Foehringer et al.

It is certified that error appears in the above-identified patent and that said Letters Patent is hereby corrected as shown below:

On the Title Pg. Item (54) in the Title, lines 1–2, delete "FOR CIRCUIT BOARD" and insert --APPARATUS --, therefor.

On the Title Pg. Item (74), in "Attorney, Agent, or Firm", line 2, delete "Wossner," and insert -- Woessner, --, therefor.

In column 1, lines 1–2, delete "FOR CIRCUIT BOARD" and insert -- APPARATUS --, therefor.

Signed and Sealed this

Twelfth Day of January, 2010

David J. Kappos
*Director of the United States Patent and Trademark Office*